(12) United States Patent
Takeda et al.

(10) Patent No.: US 7,038,354 B2
(45) Date of Patent: May 2, 2006

(54) DRIVING CIRCUIT FOR PIEZOELECTRIC TRANSFORMER, COLD-CATHODE TUBE LIGHT-EMITTING APPARATUS, LIQUID CRYSTAL PANEL AND DEVICE WITH BUILT-IN LIQUID CRYSTAL PANEL

(75) Inventors: Katsu Takeda, Osaka (JP); Hiroshi Nakatsuka, Katano (JP); Katsunori Moritoki, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 60 days.

(21) Appl. No.: 10/306,516

(22) Filed: Nov. 27, 2002

(65) Prior Publication Data
US 2003/0102776 A1 Jun. 5, 2003

(30) Foreign Application Priority Data
Nov. 29, 2001 (JP) ............................. 2001-365042

(51) Int. Cl.
*H01L 41/107* (2006.01)
(52) U.S. Cl. .................. 310/316.01; 310/318; 310/319
(58) Field of Classification Search ........... 310/316.01, 310/318, 319
See application file for complete search history.

(56) References Cited

U.S. PATENT DOCUMENTS

| | | | |
|---|---|---|---|
| 5,751,092 A | * | 5/1998 | Abe ............................. 310/359 |
| 6,278,226 B1 | * | 8/2001 | Danov et al. ................ 310/359 |
| 6,288,479 B1 | * | 9/2001 | Watanabe .................... 310/359 |
| 6,566,821 B1 | * | 5/2003 | Nakatsuka et al. ... 315/209 PZ |
| 6,586,863 B1 | * | 7/2003 | Kim et al. ................... 310/359 |
| 6,720,705 B1 | * | 4/2004 | Nakatsuka et al. .... 310/316.01 |
| 6,737,816 B1 | * | 5/2004 | Nakatsuka et al. ......... 315/291 |

FOREIGN PATENT DOCUMENTS

| | | |
|---|---|---|
| JP | 6-167694 | 6/1994 |
| JP | 8-45679 | 2/1996 |
| JP | 10-201233 | 7/1998 |
| JP | 10-241884 | 9/1998 |
| KR | 10-0365956 | 12/2002 |

* cited by examiner

Primary Examiner—Thomas M. Dougherty
(74) Attorney, Agent, or Firm—Hamre, Schumann, Mueller & Larson, P.C.

(57) ABSTRACT

A driving circuit for a piezoelectric transformer is provided, which ensures lighting of all the cold-cathode tubes connected to the piezoelectric transformer, and reduces the difference in brightness between the cathode tubes during steady lighting, thereby enhancing reliability and performance. A plurality of cold-cathode tubes connected to a secondary side of the piezoelectric transformer, and a cold-cathode tube output detector circuit connected in series to a plurality of cold-cathode tubes, for detecting an output state of the respective cold-cathode tubes are provided, and the driving of the piezoelectric transformer is controlled based on a detection signal from the cold-cathode tube output detector circuit. Because of this, the piezoelectric transformer performs the same operation as that with respect to one cold-cathode tube.

12 Claims, 13 Drawing Sheets

DRIVING CIRCUIT FOR PIEZOELECTRIC TRANSFORMER, COLD-CATHODE TUBE LIGHT-EMITTING APPARATUS, LIQUID CRYSTAL PANEL AND DEVICE WITH BUILT-IN LIQUID CRYSTAL PANEL

BACKGROUND OF THE INVENTION

1. Field of the Invention

The present invention relates to a driving circuit for a piezoelectric transformer, a cold-cathode tube light-emitting apparatus using a cold-cathode tube as a load of a piezoelectric transformer, a liquid crystal panel in which the cold-cathode tube light-emitting apparatus is built so as to control the brightness, and devices with the liquid crystal panel built therein.

2. Description of the Related Art

Hereinafter, a conventional piezoelectric transformer and driving circuit for the piezoelectric transformer will be described with reference to the drawings.

The piezoelectric transformer has a configuration in which a primary (input) side electrode and a secondary (output) side electrode are formed on a piezoelectric body, an AC voltage in the vicinity of a resonance frequency of the piezoelectric transformer is applied to the primary side electrode to vibrate the piezoelectric transformer mechanically, and the mechanical vibration is converted by a piezoelectric effect so as to be output from the secondary side electrode as a high voltage. The piezoelectric transformer can be rendered smaller and thinner, compared with an electromagnetic transformer, so that a high conversion efficiency can be realized.

FIG. 14 shows a perspective view of a conventional piezoelectric transformer 101 with one output on the secondary side. In FIG. 14, the piezoelectric transformer 101 has the following configuration: primary (input) side electrodes 102 and 103 are formed over substantially half of the principal planes of a rectangular plate 105 made of a piezoelectric ceramic material (e.g., lead zirconate titanate (PZT)) so as to be opposed in the thickness direction, and a secondary (output) side electrode 104 is formed on one end face of the rectangular plate 105 in the length direction. The rectangular plate 105 is previously polarized in the thickness direction using the electrodes 102 and 103, and is previously polarized in the length direction using the electrodes 102, 103 and the electrode 104. When an AC voltage in the vicinity of the resonance frequency of vibration that expands and contracts in the length direction of the piezoelectric transformer 101 is applied between the primary side electrodes 102 and 103, the piezoelectric transformer 101 excites mechanical vibration that expands and contracts in the length direction. The mechanical vibration is converted into a voltage by a piezoelectric effect. The voltage thus obtained is output from the electrode 104 in accordance with an impedance ratio between the primary side electrodes and the secondary side electrode.

FIG. 15 shows a perspective view of a piezoelectric transformer 111 with two outputs on the secondary side. In FIG. 15, the piezoelectric transformer 111 has the following configuration: primary side electrodes 112 and 113 are formed substantially at the center of a rectangular plate 116 (made of a piezoelectric ceramic material) in the length direction so as to be opposed in the thickness direction, a secondary side electrode 114 is formed on one end face of the piezoelectric transformer 111 in the length direction, and another secondary side electrode 115 is formed on the other end face thereof in the length direction. The rectangular plate 116 is previously polarized in the thickness direction using the electrodes 112 and 113, and is previously polarized in the length direction using the electrodes 112, 113 and the electrodes 114 and 115. When an AC voltage in the vicinity of the resonance frequency of vibration that expands and contrasts in the length direction of the piezoelectric transformer 111 is applied between the electrodes 112 and 113, the piezoelectric transformer 111 excites mechanical vibration that expands and contracts in the length direction. The mechanical vibration is converted into a voltage by a piezoelectric effect. The voltage thus obtained is output from the electrodes 114 and 115 in accordance with an impedance ratio between the primary side electrodes and the secondary side electrodes.

Generally, in the piezoelectric transformer, due to the impedance of a load connected to the secondary side, a voltage step-up ratio, which represents a ratio between a voltage input to the primary side and a voltage output from the secondary side, is varied. Furthermore, a driving efficiency represented by the electric power output from the secondary side with respect to the electric power input to the primary side is varied similarly. Therefore, the driving frequency also is varied, which enables the maximum voltage step-up ratio and driving efficiency to be obtained.

For example, in the case of using a cold-cathode tube as a load of the piezoelectric transformer, the cold-cathode tube generally exhibits a high impedance equal to or more than hundreds of MΩ until it lights up, and the impedance decreases rapidly to a range between hundreds of Ω and tens of Ω after it lights up. Furthermore, a voltage equal to or more than several kV is required for allowing the cold-cathode tube to light up, and even during steady lighting, a voltage from hundreds of V to several kV is required. In order to allow the cold-cathode tube to light up efficiently by using the piezoelectric transformer, it is required to change the frequency and the level of an AC voltage applied to the primary side of the piezoelectric transformer between a period before the commencement of lighting and a period after lighting.

As a prior art for realizing the above, a cold-cathode tube driving apparatus described in JP 6(1994)-167694 A is known. FIG. 16 shows a block diagram of a driving apparatus disclosed in this publication.

In FIG. 16, an output signal from a free-running multivibrator 206 is amplified by a current amplifier 207, and a voltage further is stepped-up by a wire-wound transformer 208, if required, to be applied to the primary side of a piezoelectric transformer 201. A cold-cathode tube 202 is connected as a load to a secondary side output of the piezoelectric transformer 201. A current flowing through the cold-cathode tube 202 is detected by a load current detector circuit 209. The detected current is converted to a voltage. The voltage thus obtained is input to one input terminal of an integrator circuit 204 through an AC voltage rectifier circuit 210, and a signal from a variable voltage apparatus 203 is supplied to the other input terminal of the integrator circuit 204. In this manner, an oscillation frequency of the free-running multivibrator 206 is controlled by the integrator circuit 204 through a voltage level shift circuit 205.

A voltage applied to the piezoelectric transformer 201 is set by the variable voltage apparatus 203, the voltage level shift circuit 205, and the like, and the driving frequency of the piezoelectric transformer 201 is swept, whereby the cold-cathode tube 202 that is a load of the piezoelectric transformer 201 is allowed to light up. After lighting, the driving frequency of the piezoelectric transformer 201 again is swept. Furthermore, a voltage applied to the piezoelectric transformer 201 is controlled by the variable voltage apparatus 203, the voltage level shift circuit 205, and the like in accordance with the level of a current detected by the load current detector circuit 209 and the like, whereby the light-emission brightness of the cold-cathode tube 202 is adjusted.

The case where a plurality of loads such as a cold-cathode tube are connected to the piezoelectric transformer is disclosed by, for example, JP 8(1996)-45679 A. In this disclosure, as shown in FIG. 17, cold-cathode tubes 120 and 121 are connected in series to the secondary side electrode 104 of the piezoelectric transformer 101 with one output on the secondary side shown in FIG. 14. In this case, both ends of one cold-cathode tube need to be supplied with a voltage of several kV until the commencement of lighting and a voltage of hundreds of V during steady lighting. Therefore, the piezoelectric transformer 101 is required to output a high voltage based on the number of cold-cathode tubes to be connected.

Therefore, it is required to configure the connection portion and wiring between the piezoelectric transformer 101 and the cold-cathode tube 120, and a circuit board so that they withstand a high voltage. Furthermore, regarding the mounting of circuit components including the piezoelectric transformer on the circuit board, it is required to enlarge the distance between the respective components so as to avoid an insulation breakdown due to a high voltage and enhance safety. Therefore, there is a limit to the enhancement of a mounting density. Even if the piezoelectric transformer and the circuit components are miniaturized, a system including the circuit board cannot be miniaturized and its space cannot be reduced.

Furthermore, there is another conventional example in which a plurality of cold-cathode tubes are connected to the piezoelectric transformer with one output on the secondary side shown in FIG. 14. More specifically, as shown in FIG. 18, the cold-cathode tubes 120 and 121 are connected in parallel to the secondary side electrode 104 of the piezoelectric transformer 101. In this case, due to the variation of impedances of the cold-cathode tubes 120 and 121, a lighting commencement time is varied therebetween. For example, when the cold-cathode tube 120 starts lighting up first, the impedance of the cold-cathode tube 120 rapidly is decreased. Because of this, the voltage step-up ratio of the piezoelectric transformer 101 is decreased, and the cold-cathode tube 121 other than the cold-cathode tube 120 that has started lighting up first cannot keep a voltage level at which lighting can start. As a result, only one cold-cathode tube lights up.

Furthermore, JP 8(1996)-45679 A discloses another conventional example in which a plurality of cold-cathode tubes are connected to the piezoelectric transformer 111 with two outputs on the secondary side shown in FIG. 15. In this disclosure, as shown in FIG. 19, the cold-cathode tubes 120 and 121 are connected in series to the secondary side electrodes 114 and 115 of the piezoelectric transformer 111. Unlike the method shown in FIG. 18, the following state can be avoided: due to the variation of impedances of the cold-cathode tubes 120 and 121, only one cold-cathode tube lights up while the other does not.

Since the connection portion between the cold-cathode tubes 120 and 121 is connected electrically to one primary side electrode 113, non-lighting can be avoided. However, the difference in brightness is caused by the difference in impedance between two cold-cathode tubes during steady lighting. In addition, the piezoelectric transformer 111 needs to perform an unstable operation of continuously supplying different electric powers from two secondary side electrodes 114 and 115.

SUMMARY OF THE INVENTION

Therefore, with the foregoing in mind, it is an object of the present invention to provide a driving circuit for a piezoelectric transformer that ensures lighting of all the cold-cathode tubes when a plurality of cold-cathode tubes are connected to a piezoelectric transformer and reduces the difference in brightness between respective cold-cathode tubes to an unrecognizable level during steady lighting, thereby enhancing reliability and performance; a cold-cathode tube light-emitting apparatus using the driving circuit for a piezoelectric transformer; a liquid crystal panel in which the cold-cathode tube light-emitting apparatus is built so as to control the brightness; and devices with the liquid crystal panel built therein.

In order to achieve the above-mentioned object, a first driving circuit of the present invention for a piezoelectric transformer, which includes a primary side electrode and a secondary side electrode formed on a piezoelectric body and converting an AC voltage input from the primary side electrode to output the converted AC voltage from the secondary side electrode, includes: a plurality of loads connected to a secondary side of the piezoelectric transformer; and a load state detector portion connected in series to the plurality of loads, for detecting an output state of each load, wherein driving of the piezoelectric transformer is controlled based on a detection signal from the load state detector portion.

According to the above-mentioned configuration, in the case where cold-cathode tubes are used as loads of the piezoelectric transformer, even if a plurality of cold-cathode tubes have different impedances, the difference in brightness between the respective cold-cathode tubes is small during steady lighting, and non-lighting of the cold-cathode tubes at the commencement of lighting is unlikely to occur.

In order to achieve the above-mentioned object, a second driving circuit of the present invention for a piezoelectric transformer including a primary side electrode and a secondary side electrode formed on a piezoelectric body and converting an AC voltage input from the primary side electrode to output the converted AC voltage from the secondary side electrode includes: a plurality of loads connected to a secondary side of the piezoelectric transformer; and a load state detector portion connected in series to the plurality of loads, for electrically separating and detecting an output state of each load, wherein driving of the piezoelectric transformer is controlled based on a detection signal from the load state detector portion.

According to the above-mentioned configuration, in the case where cold-cathode tubes are used as loads of the piezoelectric transformer, in addition to the effect of the first driving circuit for a piezoelectric transformer, a ratio at which a current flowing through the cold-cathode tubes and a detection signal influence each other can be suppressed. Therefore, noise resistance of both a current flowing through the cold-cathode tubes and a detection signal can be enhanced.

In order to achieve the above-mentioned object, a third driving circuit of the present invention for a piezoelectric transformer, which includes a primary side electrode and a secondary side electrode formed on a piezoelectric body and converting an AC voltage input from the primary side electrode to output the converted AC voltage from the secondary side electrode, includes: a plurality of loads connected to a secondary side of the piezoelectric transformer; a load state detector portion connected in series to the plurality of loads, for detecting an output state of each load; and a frequency selection portion for selectively outputting only a frequency component in a vicinity of a driving frequency of the piezoelectric transformer in a detection signal from the load state detector portion, wherein driving of the piezoelectric transformer is controlled based on a signal from the frequency selection portion.

According to the above-mentioned configuration, in the case where cold-cathode tubes are used as loads of the piezoelectric transformer, in addition to the effect of the first driving circuit for a piezoelectric transformer, an unnecessary harmonic component can be removed, and the driving control of the piezoelectric transformer and the brightness control of the cold-cathode tubes can be performed with a higher precision.

In order to achieve the above-mentioned object, a cold-cathode tube light-emitting apparatus of the present invention includes: a piezoelectric transformer including a primary side electrode and a secondary side electrode formed on a piezoelectric body and converting an AC voltage input from the primary side electrode to output the converted AC voltage from the secondary side electrode; a plurality of cold-cathode tubes connected to a secondary side of the piezoelectric transformer; a cold-cathode tube output detector portion connected in series to the plurality of cold-cathode tubes, for electrically separating and detecting a current flowing through the respective cold-cathode tubes; and a control portion for controlling light-emission of the plurality of cold-cathode tubes based on a detection signal from the cold-cathode tube output detector portion.

In order to achieve the above-mentioned object, a liquid crystal panel of the present invention has its brightness controlled by a built-in cold-cathode tube light-emitting apparatus, and the cold-cathode tube light-emitting apparatus includes: a piezoelectric transformer including a primary side electrode and a secondary side electrode formed on a piezoelectric body and converting an AC voltage input from the primary side electrode to output the converted AC voltage from the secondary side electrode; a plurality of cold-cathode tubes connected to a secondary side of the piezoelectric transformer; a cold-cathode tube output detector portion connected in series to the plurality of cold-cathode tubes, for electrically separating and detecting a current flowing through the respective cold-cathode tubes; and a control portion for controlling light-emission of the plurality of cold-cathode tubes based on a detection signal from the cold-cathode tube output detector portion.

According to the above-mentioned configuration, an output voltage of a piezoelectric transformer is varied in accordance with a load fluctuation at the commencement of lighting and during lighting of the cold-cathode tubes. Therefore, an adverse effect on another circuit system mounted on a liquid crystal panel can be eliminated. Furthermore, an output voltage to the cold-cathode tubes has a substantially sine wave, so that an unnecessary frequency component that does not contribute to lighting of the cold-cathode tubes also can be reduced. Furthermore, the piezoelectric transformer can be mounted even in a narrow place such as an edge of a liquid crystal panel, which leads to miniaturization and reduced weight of the liquid crystal panel. Furthermore, a lighting defect of the cold-cathode tubes is decreased, and the piezoelectric transformer can be driven stably, which leads to high reliability and high performance of the liquid crystal panel itself.

In order to achieve the above-mentioned object, a device with a built-in liquid crystal panel of the present invention incorporates a liquid crystal panel whose brightness is controlled by a built-in cold-cathode tube light-emitting apparatus. The cold-cathode tube light-emitting apparatus includes: a piezoelectric transformer including a primary side electrode and a secondary side electrode formed on a piezoelectric body, for converting an AC voltage input from the primary side electrode to output the converted AC voltage from the secondary side electrode; a plurality of cold-cathode tubes connected to a secondary side of the piezoelectric transformer; a cold-cathode tube output detector portion connected in series to the plurality of cold-cathode tubes, for electrically separating and detecting a current flowing through the respective cold-cathode tubes; and a control portion for controlling light-emission of the plurality of cold-cathode tubes based on a detection signal from the cold-cathode tube output detector portion.

According to the above-mentioned configuration, even when the number of cold-cathode tubes is small, high brightness of a liquid crystal screen can be realized. In addition, by using a piezoelectric transformer instead of an electromagnetic transformer in order to allow the cold-cathode tubes to light up, the generation of electromagnetic noise can be suppressed, and noise to a device and an adverse effect due to cross modulation can be eliminated.

In the first to third driving circuits for a piezoelectric transformer, cold-cathode tube light-emitting apparatus, liquid crystal panel, and devices with a built-in liquid crystal panel according to the present invention, the piezoelectric body has a rectangular shape and the secondary side electrode of the piezoelectric transformer is provided on each end face of the piezoelectric body in a longitudinal direction, and polarization directions of the piezoelectric body in a vicinity of the secondary side electrodes are the same in the longitudinal direction.

According to the above-mentioned configuration, AC voltages having substantially the same amplitude and a phase difference of 180° can be output from two secondary side electrodes.

Furthermore, in the first to third driving circuits for a piezoelectric transformer, cold-cathode tube light-emitting apparatus, liquid crystal panel, and devices with a built-in liquid crystal panel according to the present invention, in the case where cold-cathode tubes are used as loads of the piezoelectric transformer, it is preferable that the number of the cold-cathode tubes is 2n (n is an integer of 1 or more).

According to the above-mentioned configuration, a voltage applied to the cold-cathode tubes becomes substantially zero at a connection portion of the cold-cathode tubes instead of the inside thereof. Therefore, a dark portion at which the brightness is decreased at all times can be eliminated.

Furthermore, in the second driving circuit for a piezoelectric transformer, cold-cathode tube light-emitting apparatus, liquid crystal panel, and devices with a built-in liquid crystal panel according to the present invention, it is preferable that the load state detector portion includes an optical isolator composed of a light-emitting diode and a phototransistor.

According to the above-mentioned configuration, in the case where cold-cathode tubes are used as loads of the piezoelectric transformer, a current flowing through the cold-cathode tubes is separated electrically from a detection signal without using an inductive element. Therefore, even when the difference in impedance between a plurality of cold-cathode tubes is large, there is no noise generation factor, and noise resistance of both a current flowing through the cold-cathode tubes and a detection signal can be enhanced further.

Furthermore, in the cold-cathode tube light-emitting apparatus, liquid crystal panel, and devices with a built-in liquid crystal panel according to the present invention, it is preferable that the piezoelectric transformer and the control portion are mounted on a first substrate placed in proximity to one electrode of each of the plurality of cold-cathode tubes, and the cold-cathode tube output detector portion is mounted on a second substrate placed in proximity to the other electrode of each of the plurality of cold-cathode tubes.

According to the above-mentioned configuration, a portion that deals with a relatively large electric power including the piezoelectric transformer is separated from a portion that deals with a small electric power including the cold-cathode tube output detector portion by using separate substrates. Because of this, the ability of the cold-cathode tube output detector portion to detect a current flowing through the cold-cathode tubes can be enhanced, and noise (in particular, noise due to the proximity to a ground line) can be suppressed from being mixed in a detection signal output from the cold-cathode tube output detector portion.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative embodiments with reference to the drawings.

Embodiment 1

Figure 1:
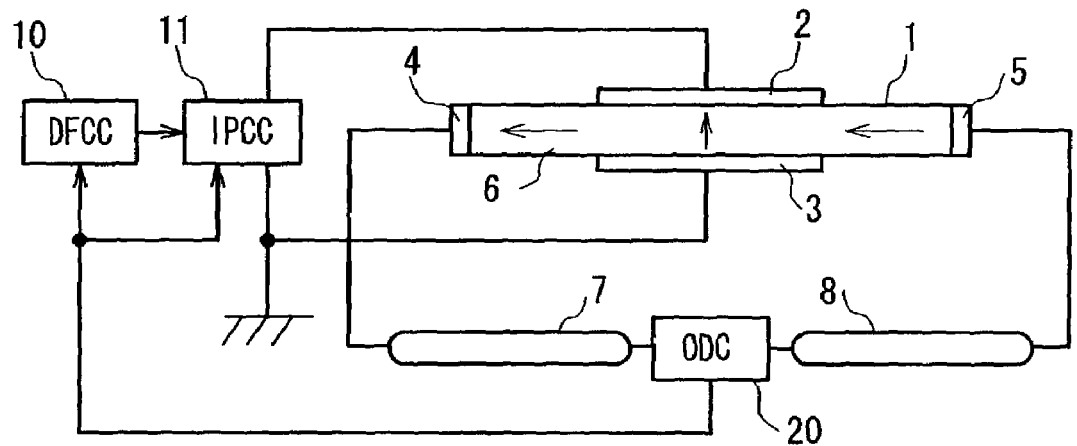
FIG. 1 is a block diagram showing an exemplary configuration of a driving circuit for a piezoelectric transformer of Embodiment 1 according to the present invention.

FIG. 1 is a block diagram showing an exemplary configuration of a driving circuit for a piezoelectric transformer of Embodiment 1 according to the present invention. In FIG. 1, reference numeral 1 denotes a piezoelectric transformer with two outputs on a secondary side; 2, 3 denote primary side electrodes of the piezoelectric transformer 1; 4,5 denote secondary side electrodes of the piezoelectric transformer 1; 7,8 denote cold-cathode tubes; 10 denotes a driving frequency control circuit (DFCC); 11 denotes an input power control circuit (IPCC); and 20 denotes a cold-cathode tube output detector circuit (ODC).

Figure 2:
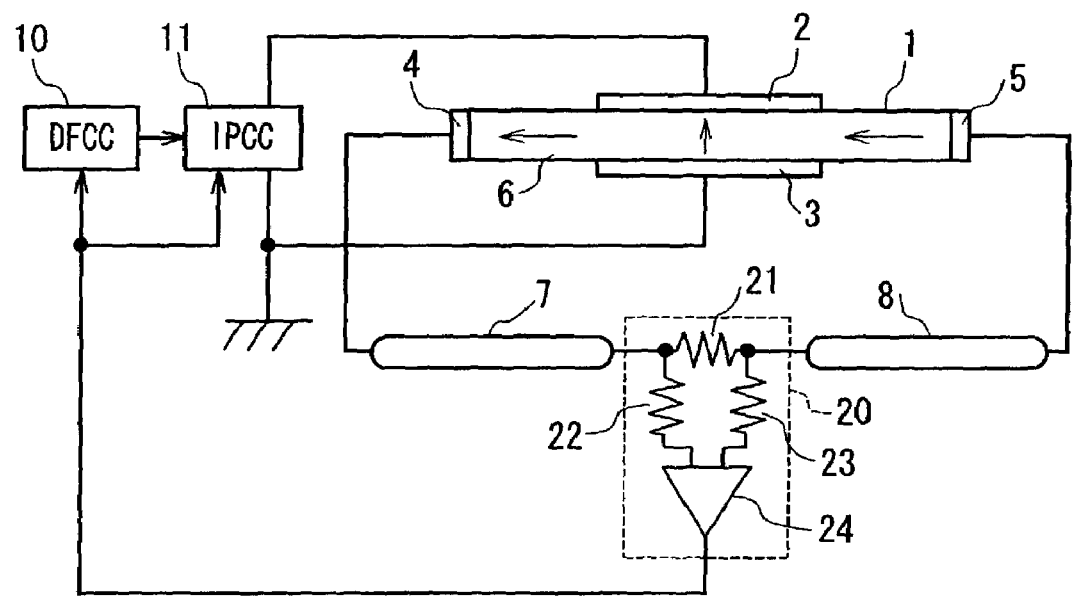
FIG. 2 is a block diagram showing the exemplary configuration of the driving circuit for a piezoelectric transformer shown in FIG. 1, and an exemplary internal configuration of a cold-cathode tube output detector circuit 20.

FIG. 2 is a block diagram showing an exemplary internal configuration of the cold-cathode tube output detector circuit 20 in the driving circuit for a piezoelectric transformer of Embodiment 1 according to the present invention. In FIG. 2, the cold-cathode tube output detector circuit 20 is composed of resistors 21, 22 and 23, and a differential amplifier 24.

Next, the operation of the driving circuit shown in FIGS. 1 and 2 will be described.

The input power control circuit 11 supplies an AC power to the piezoelectric transformer 1 based on a signal of a driving frequency and a voltage level output from the driving frequency control circuit 10. In accordance with a ratio between the impedance between the primary side electrodes 2 and 3 of the piezoelectric transformer 1 and the impedance between the secondary side electrodes 4 and 5 thereof, voltages stepped-up with respect to the input voltage are output from the secondary side electrodes 4 and 5. The secondary side electrodes 4 and 5 constituting the piezoelectric transformer 1 are formed symmetrically with respect to the primary side electrodes 2 and 3 formed at the center of the rectangular plate 6 in the length direction, and the vicinities of the secondary side electrodes 4 and 5 are polarized in the same direction as shown in FIG. 1. Therefore, AC voltages with substantially the same amplitude and a phase difference of 180° are output from the two secondary side electrodes 4 and 5. The output AC voltages are applied to the cold-cathode tubes 7 and 8, and currents flow therethrough in accordance with the respective impedances.

Furthermore, in FIG. 2, the resistor 21 is connected between the cold-cathode tubes 7 and 8, and the electric potential at both ends of the resistor 21 is detected by the differential amplifier 24 through the resistors 22 and 23. The driving frequency control circuit 10 and the input power control circuit 11 control the driving frequency or input voltage of the piezoelectric transformer 1 to control the driving of the piezoelectric transformer 1, based on a signal from the cold-cathode tube output detector circuit 20.

For example, in the case of using cold-cathode tubes of 6 W, a current flowing through one cold-cathode tube is 10 mA, and an applied voltage thereto is 600 V during steady lighting. Before the commencement of lighting, an applied voltage is in a range of 1 kV to 1.5 kV. The output power of the piezoelectric transformer 1 is varied depending upon an impedance change of the cold-cathode tubes 7 and 8 connected to the piezoelectric transformer 1, so that the shapes of the cold-cathode tubes 7 and 8 are designed so as to correspond to required voltage, current and power.

Furthermore, the driving frequency generally is about 40 kHz to 80 kHz. The lower limit of the driving frequency is determined as a value that is not in an audio range, and the upper limit of the driving frequency is determined based on the relationship with respect to a system for mounting cold-cathode tubes. With a single cold-cathode tube, as the driving frequency becomes higher, the brightness efficiency is increased. In the case where an electromagnetic transformer is driven at about 100 kHz or more, the conversion efficiency is decreased. However, in the case where a piezoelectric transformer is driven at 100 kHz or more, the conversion efficiency is not decreased. However, a reflector is placed in parallel between cold-cathode tubes when cold-cathode tubes are mounted on a liquid crystal panel or the like. Therefore, a stray capacitance is generated between the cold-cathode tubes and the reflector. In the case where the driving frequency is high, a current flows from the cold-cathode tubes to the reflector through the stray capacitance. Then, even if an electric power is supplied from the piezoelectric transformer, a current flows through the reflector instead of the cold-cathode tubes, which results in a decrease in a brightness efficiency with respect to the electric power on the side of the piezoelectric transformer. Because of this, the upper limit of the driving frequency is determined.

Figure 19:
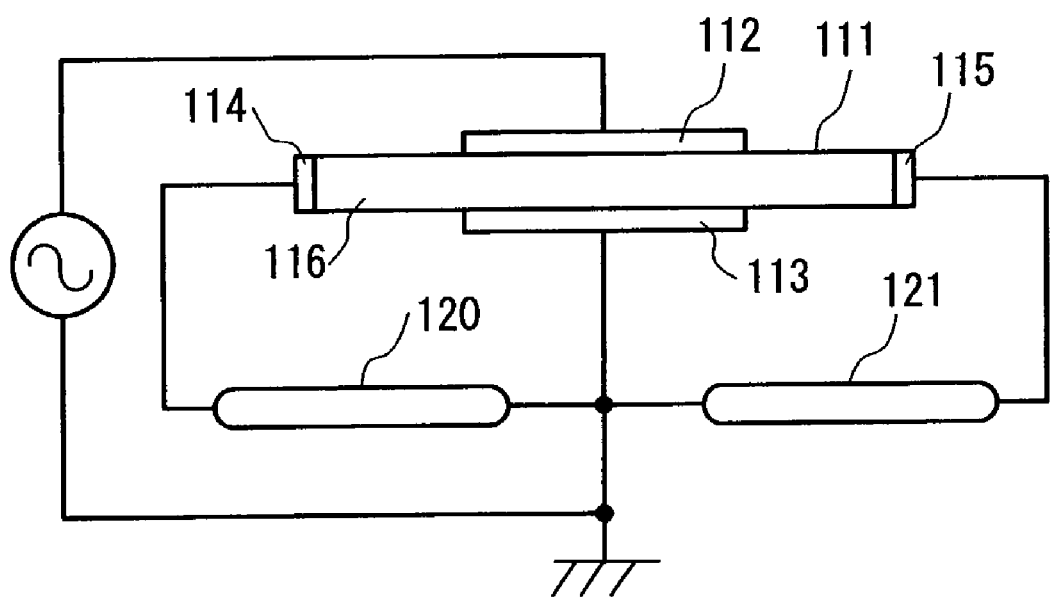
FIG. 19 is a schematic diagram showing a configuration of a cold-cathode tube lighting apparatus in which the piezoelectric transformer shown in FIG. 15 is connected in series to the cold-cathode tubes.

According to the present embodiment, although one primary side electrode 3 of the piezoelectric transformer 1 is grounded, the connection portion between the cold-cathode tubes 7 and 8 is not grounded unlike the method shown in FIG. 19. Therefore, irrespective of whether there are two cold-cathode tubes, the piezoelectric transformer 1 performs the same operation as that with respect to one cold-cathode tube. Accordingly, even if the respective impedances of two cold-cathode tubes are different from each other, the difference in brightness is sufficiently smaller than a recognizable level during steady lighting. Furthermore, the operation in which only one cold-cathode tube lights up at the commencement of lighting is unlikely to occur.

The present embodiment is not limited to the driving circuit composed of the components shown in FIG. 1. Other components may be used as long as they can function in the same way as in FIG. 1.

Furthermore, it also is possible to set the driving frequency and the input voltage of the piezoelectric transformer through software by using a microcomputer, a peripheral apparatus such as a data storage device (e.g., memory) and the like, instead of setting them by the driving frequency control circuit 10 and the input power control circuit 11, based on the signal from the cold-cathode tube output detector circuit 20.

Embodiment 2

Figure 3:
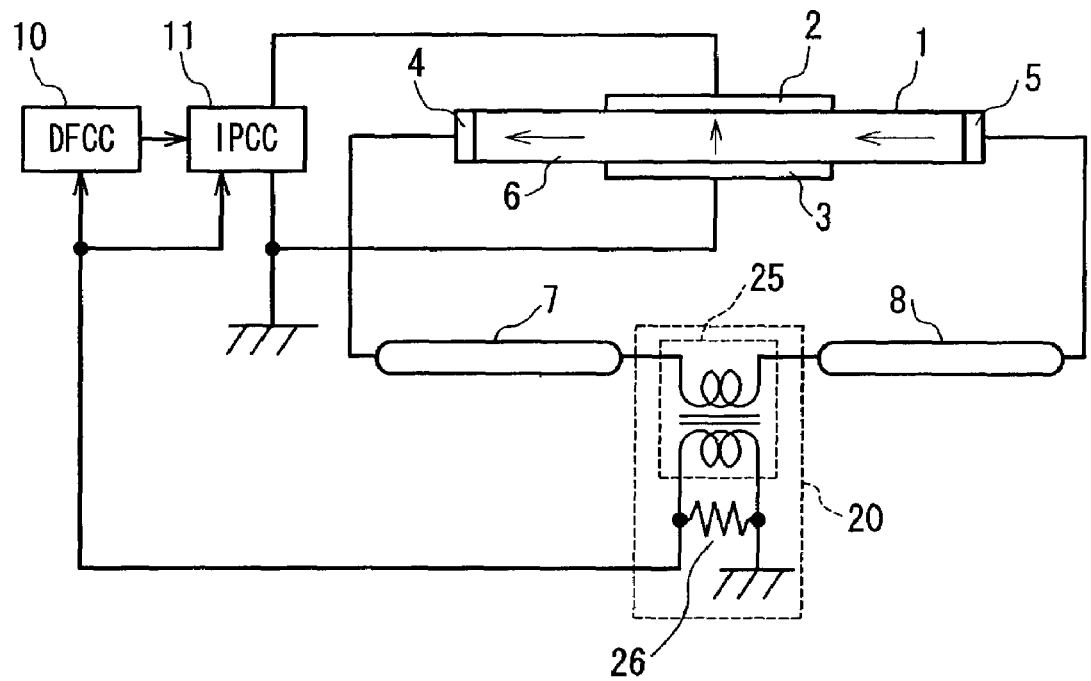
FIG. 3 is a block diagram showing an exemplary configuration of a driving circuit for a piezoelectric transformer of Embodiment 2 according to the present invention and an exemplary internal configuration of the cold-cathode tube output detector circuit 20.

FIG. 3 is a block diagram showing an exemplary configuration of a driving circuit for a piezoelectric transformer of Embodiment 2 according to the present invention. In FIG. 3, the same components as those in FIG. 2 are denoted with the same reference numerals as those therein, and the description thereof will be omitted here. In the present embodiment, the configuration of the cold-cathode tube output detector circuit 20 is different from that of Embodiment 1.

In FIG. 3, the cold-cathode tube output detector circuit 20 of the present embodiment is composed of a current transformer 25 and a resistor 26.

Next, the operation of the driving circuit shown in FIG. 3 will be described.

The procedure of controlling the driving of the piezoelectric transformer 1 is the same as that of Embodiment 1. A primary side winding of the current transformer 25 of the cold-cathode tube output detector circuit 20 is connected between the cold-cathode tubes 7 and 8. A current induced in a secondary side winding of the current transformer 25 is converted to a voltage by the resistor 26 in accordance with a current flowing through the primary side winding of the current transformer 25. The voltage thus obtained is used as a control signal for driving control by the driving frequency control circuit 10 and the input power control circuit 11.

According to the present embodiment, in addition to the effect of Embodiment 1, the following effect can be obtained. In the cold-cathode tube output detector circuit 20, a current flowing through the cold-cathode tubes 7 and 8 and a detection signal are separated electrically by the current transformer 25. Therefore, a ratio at which a current flowing through the cold cathode tubes 7 and 8 and a detection signal influence each other can be suppressed, and the noise resistance of the current flowing through the cold-cathode tubes 7 and 8 and the detection signal can be enhanced.

The present embodiment is not limited to the driving circuit composed of the components shown in FIG. 3, and other components may be used as long as they function in the same way as in FIG. 3.

Furthermore, in the same way as in Embodiment 1, it also is possible to set the driving frequency and the input voltage of the piezoelectric transformer through software by using a microcomputer, a peripheral apparatus such as a data storage device (e.g., memory) and the like, instead of setting them by the driving frequency control circuit 10 and the input power control circuit 11, based on the signal from the cold-cathode tube output detector circuit 20.

Embodiment 3

Figure 4:
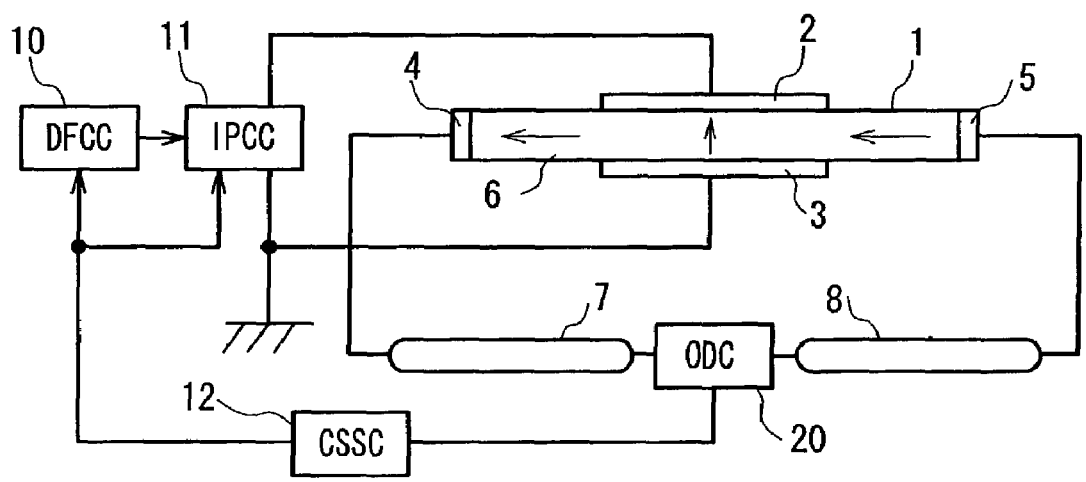
FIG. 4 is a block diagram showing an exemplary configuration of a driving circuit for a piezoelectric transformer of Embodiment 3 according to the present invention, and an exemplary internal configuration of the cold-cathode tube output detector circuit 20.

FIG. 4 is a block diagram showing an exemplary configuration of a driving circuit for a piezoelectric transformer of Embodiment 3 according to the present invention. In FIG. 4, the same components as those in FIGS. 1, 2, and 3 are denoted with the same reference numerals as those therein, and the description thereof will be omitted here. The present embodiment is different from Embodiments 1 and 2 in that a control signal selection circuit 12 (CSSC) is provided, and the driving frequency control circuit 10 and the input power control circuit 11 receive a signal detected by the cold-cathode tube output detector circuit 20 through the control signal selection circuit 12.

During steady lighting of the cold-cathode tubes 7 and 8, a harmonic component other than a frequency component of an output signal of the piezoelectric transformer 1 may be superimposed to degrade the quality of a control signal, depending upon the difference in impedance between the two cold-cathode tubes 7 and 8.

By allowing the control signal selection circuit 12 of the present embodiment to select or extract only a frequency (driving frequency of the piezoelectric transformer 1) component of an output signal of the piezoelectric transformer 1 among signals of the cold-cathode tube output detector circuit 20, only the frequency component of the output signal of the piezoelectric transformer 1 can be used as a control signal. Therefore, in addition to the effects of Embodiments 1 and 2, the driving control of the piezoelectric transformer and the brightness control of the cold-cathode tubes can be performed with a higher precision.

The present embodiment is not limited to the driving circuit composed of the components shown in FIG. 4, and other components may be used as long as they function in the same way as in FIG. 4.

Furthermore, in the same way as in Embodiments 1 and 2, it also is possible to set the driving frequency and the input voltage of the piezoelectric transformer through software by using a microcomputer, a peripheral apparatus such as a data storage device (e.g., memory) and the like, instead of setting them by the driving frequency control circuit 10 and the input power control circuit 11, based on the signal from the cold-cathode tube output detector circuit 20.

Embodiment 4

Figure 5:
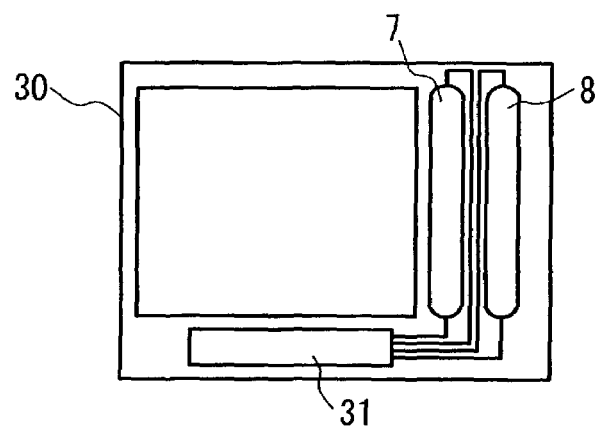
FIG. 5 is a schematic view showing an internal configuration of a liquid crystal panel of Embodiment 4 according to the present invention.

FIG. 5 shows, as Embodiment 4 of the present invention, an internal configuration in which the driving circuit for a piezoelectric transformer of Embodiment 1, 2, or 3 is used as an inverter circuit for driving cold-cathode tubes that function as a backlight of a liquid crystal panel of a liquid crystal display, a liquid crystal monitor, or the like In FIG. 5, reference numeral 30 denotes a liquid crystal panel, 31 denotes an inverter circuit, and 7,8 denote cold-cathode tubes.

In a conventional electromagnetic transformer, it is required to keep outputting a high voltage at the commencement of lighting of cold-cathode tubes. However, an output voltage of a piezoelectric transformer is varied in accordance with a load fluctuation at the commencement of lighting and during lighting of the cold-cathode tubes. Therefore, by using the piezoelectric transformer, an adverse effect on another circuit system mounted on a liquid crystal panel can be eliminated. Furthermore, an output voltage to the cold-cathode tubes has a substantially sine wave, so that an unnecessary frequency component that does not contribute to lighting of the cold-cathode tubes can be reduced.

Furthermore, the piezoelectric transformer can deal with electric energy larger than that of the electromagnetic transformer per unit volume. Therefore, the piezoelectric transformer can be reduced in volume. Furthermore, the piezoelectric transformer uses vibration in the length direction of a rectangular plate, which is advantageous to thinning of the piezoelectric transformer. As a result, the piezoelectric transformer can be mounted even in a narrow place such as an edge of a liquid crystal panel, which leads to miniaturization and reduced weight of the liquid crystal panel.

Furthermore, in a conventional piezoelectric transformer, a high voltage based on the number of cold-cathode tubes needs to be generated so as to allow a plurality of cold-cathode tubes to light up. A lighting defect occurs among a plurality of cold cathode tubes, and the piezoelectric transformer is driven in an unstable load state. However, according to the present embodiment, a lighting defect of the cold-cathode tubes is decreased, and the piezoelectric transformer can be driven stably, which leads to high reliability and high performance of the liquid crystal panel itself.

Embodiment 5

Figure 6:
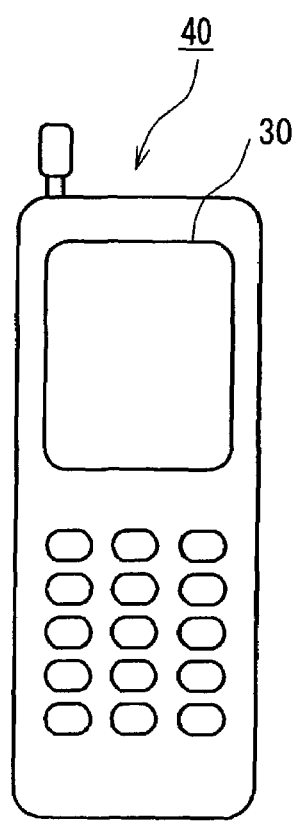
FIG. 6 is a schematic view showing a configuration of a mobile phone of Embodiment 5 according to the present invention.

FIG. 6 shows, as Embodiment 5 of the present invention, an external configuration in which the liquid crystal panel of Embodiment 4 is mounted on a mobile phone. The liquid crystal panel of Embodiment 4, i.e., the liquid crystal panel 30 with the driving circuit for a piezoelectric transformer of Embodiment 1, 2, or 3 built therein is mounted on, for example, a mobile phone 40 as a device, whereby a plurality of cold-cathode tubes are allowed to light up with one piezoelectric transformer. Therefore, higher brightness of a liquid crystal screen can be realized.

Furthermore, by using a piezoelectric transformer instead of an electromagnetic transformer in order to allow cold-cathode tubes to light up, electromagnetic noise can be suppressed. Therefore, an adverse effect on a device due to noise and cross modulation can be eliminated.

In the present embodiment, the case where the liquid crystal panel of Embodiment 4 is mounted on a mobile phone has been described. However, the same effect can be obtained even when the liquid crystal panel is mounted on a personal digital assistant, a communication terminal, or the like.

Embodiment 6

Figure 7:
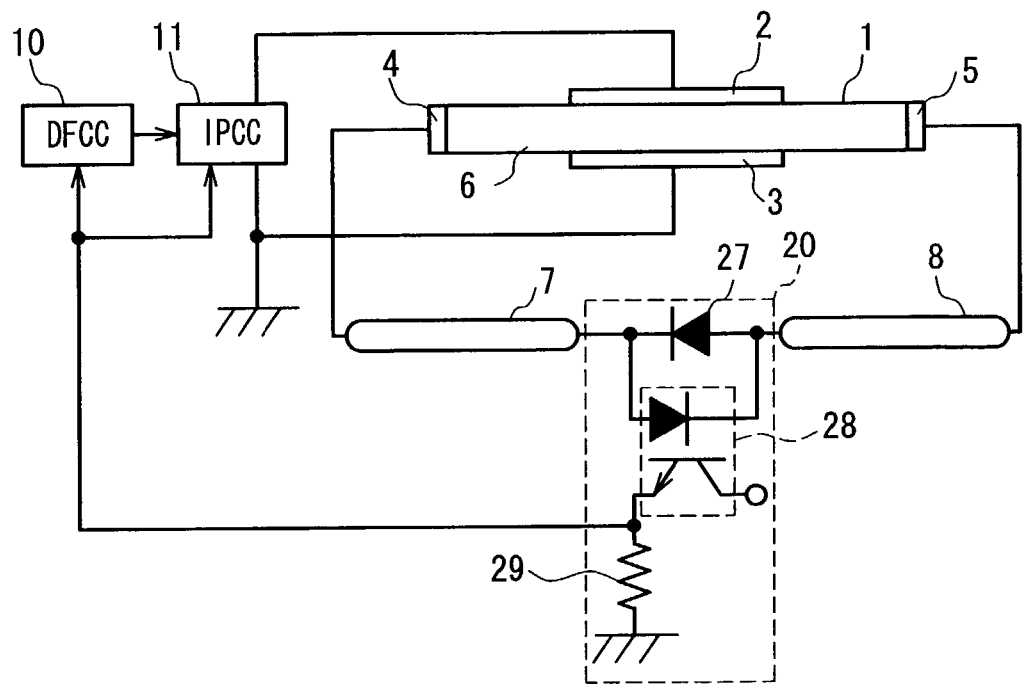
FIG. 7 is a block diagram showing an exemplary configuration of a driving circuit for a piezoelectric transformer of Embodiment 6 according to the present invention, and an exemplary internal configuration of the cold-cathode tube output detector circuit 20.

FIG. 7 is a block diagram showing an exemplary configuration of a driving circuit for a piezoelectric transformer of Embodiment 6 according to the present invention. In FIG. 7, the same components as those in FIGS. 1, 2, and 3 are denoted with the same reference numerals as those therein, and the description thereof will be omitted here. In the present embodiment, the configuration of the cold-cathode tube output detector circuit 20 is different from those in Embodiments 1 and 2.

In FIG. 7, the cold-cathode tube output detector circuit 20 in the present embodiment is composed of a diode 27, an optical isolator (photocoupler) 28, and a resistor 29.

Next, the operation of the driving circuit shown in FIG. 7 will be described.

The procedure of controlling the driving of the piezoelectric transformer 1 is the same as those of Embodiments 1 and 2. The diode 27 and the optical isolator 28 of the cold-cathode tube output detector circuit 20 are connected between the cold-cathode tubes 7 and 8. The diode 27 is connected in parallel to a light-emitting diode built on an input side of the optical isolator 28 so that a current flows in an opposite direction to that of the light-emitting diode.

Light with an intensity in accordance with a current flowing through the light-emitting diode built in the optical isolator 28 is received by a phototransistor, and a current converted photoelectrically by the phototransistor is converted to a voltage as a detection signal by the resistor 29. The detection signal is used for driving control by the driving frequency control circuit 10 and the input power control circuit 11.

In the present embodiment, in addition to the effect of Embodiment 1, a current flowing through the cold-cathode tubes 7 and 8 and a detection signal can be separated electrically in a similar manner to that of Embodiment 2.

Furthermore, when an inductive element is used for the cold-cathode tube output detector circuit 20, if the difference in impedance between the cold-cathode tubes 7 and 8 is large, or depending upon the characteristics of the inductive element, a differential component with respect to a fluctuation of a current flowing through the cold-cathode tubes 7 and 8 with a change of time may become a noise generation factor on the side of the detection signal.

However, according to the present embodiment, by configuring the cold-cathode tube output detector circuit 20 without using an inductive element, a noise generation factor can be eliminated, and a current flowing through the cold-cathode tubes 7 and 8 and a detection signal can be separated electrically. Therefore, noise resistance further can be enhanced.

The present embodiment is not limited to the driving circuit composed of the components shown in FIG. 7, and other components may be used as long as they function in the same way as in FIG. 7.

Furthermore, in the same way as in Embodiments 1 and 2, it also is possible to set the driving frequency and the input voltage of the piezoelectric transformer through software by using a microcomputer, a peripheral apparatus such as a data storage device (e.g., memory) and the like, instead of setting them by the driving frequency control circuit 10 and the input power control circuit 11, based on the signal from the cold-cathode tube output detector circuit 20.

Embodiment 7

Figure 8:
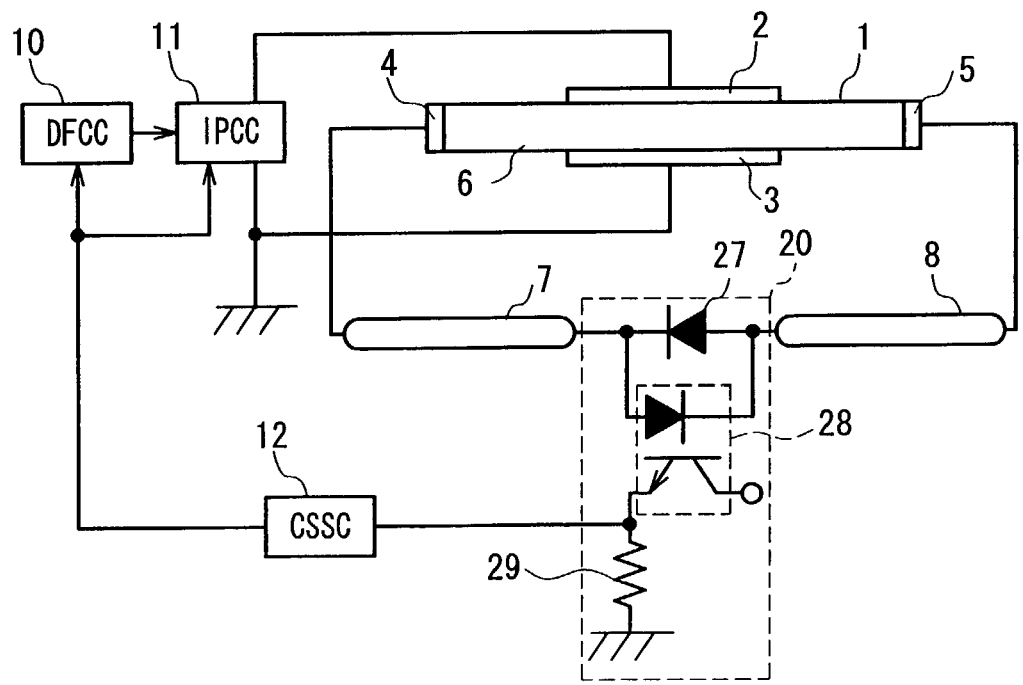
FIG. 8 is a block diagram showing an exemplary configuration of a driving circuit for a piezoelectric transformer of Embodiment 7 according to the present invention, and an exemplary internal configuration of the cold-cathode tube output detector circuit 20.

FIG. 8 is a block diagram showing an exemplary configuration of a driving circuit for a piezoelectric transformer of Embodiment 7 according to the present invention. In FIG. 8, the same components as those in FIGS. 1, 2, 3 and 7 are denoted with the same reference numerals as those therein, and the description thereof will be omitted here. The present embodiment is different from Embodiments 1, 2, and 3 in that a control signal selection circuit (CSSC) 12 is provided, and the driving frequency control circuit 10 and the input power control circuit 11 receive a signal detected by the cold-cathode tube output detector circuit 20 through the control signal selection circuit 12.

In the same way as in Embodiment 3, by allowing the control signal selection circuit 12 to select or extract only a frequency (driving frequency of the piezoelectric transformer 1) component of an output signal of the piezoelectric transformer 1 among signals of the cold-cathode tube output detector circuit 20, only a frequency component of an output signal of the piezoelectric transformer 1 can be used as a control signal. Therefore, in addition to the effects of Embodiments 1, 2, and 6, the driving control of the piezoelectric transformer and the brightness control of the cold-cathode tubes can be performed with a higher precision.

The present embodiment is not limited to the driving circuit composed of the components shown in FIG. 8, and other components may be used as long as they function in the same way as in FIG. 8.

Furthermore, in the same way as in Embodiments 1, 2, 3, and 6, it also is possible to set the driving frequency and the input voltage of the piezoelectric transformer through software by using a microcomputer, a peripheral apparatus such as a data storage device (e.g., memory) and the like, instead of setting them by the driving frequency control circuit 10 and the input power control circuit 11, based on the signal from the cold-cathode tube output detector circuit 20.

Embodiment 8

Figure 9:
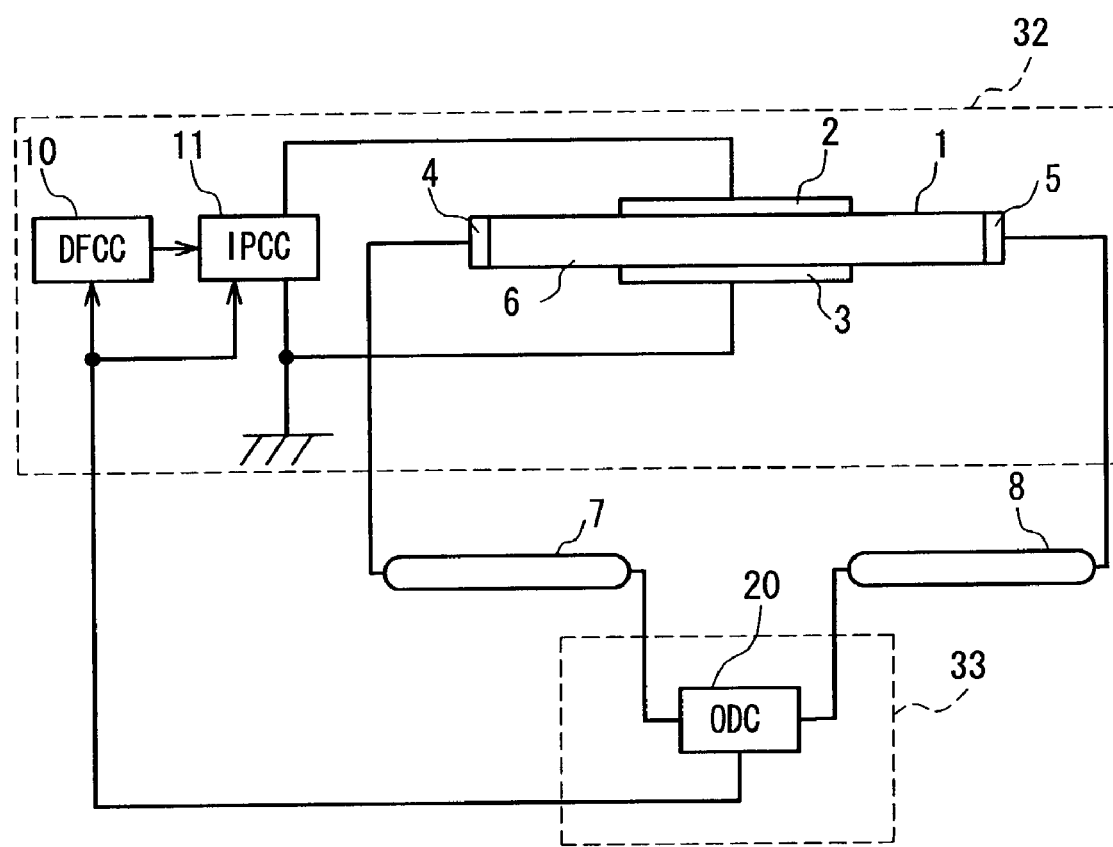
FIG. 9 is a block diagram showing an exemplary configuration of a driving circuit for a piezoelectric transformer of Embodiment 8 according to the present invention.
Figure 10:
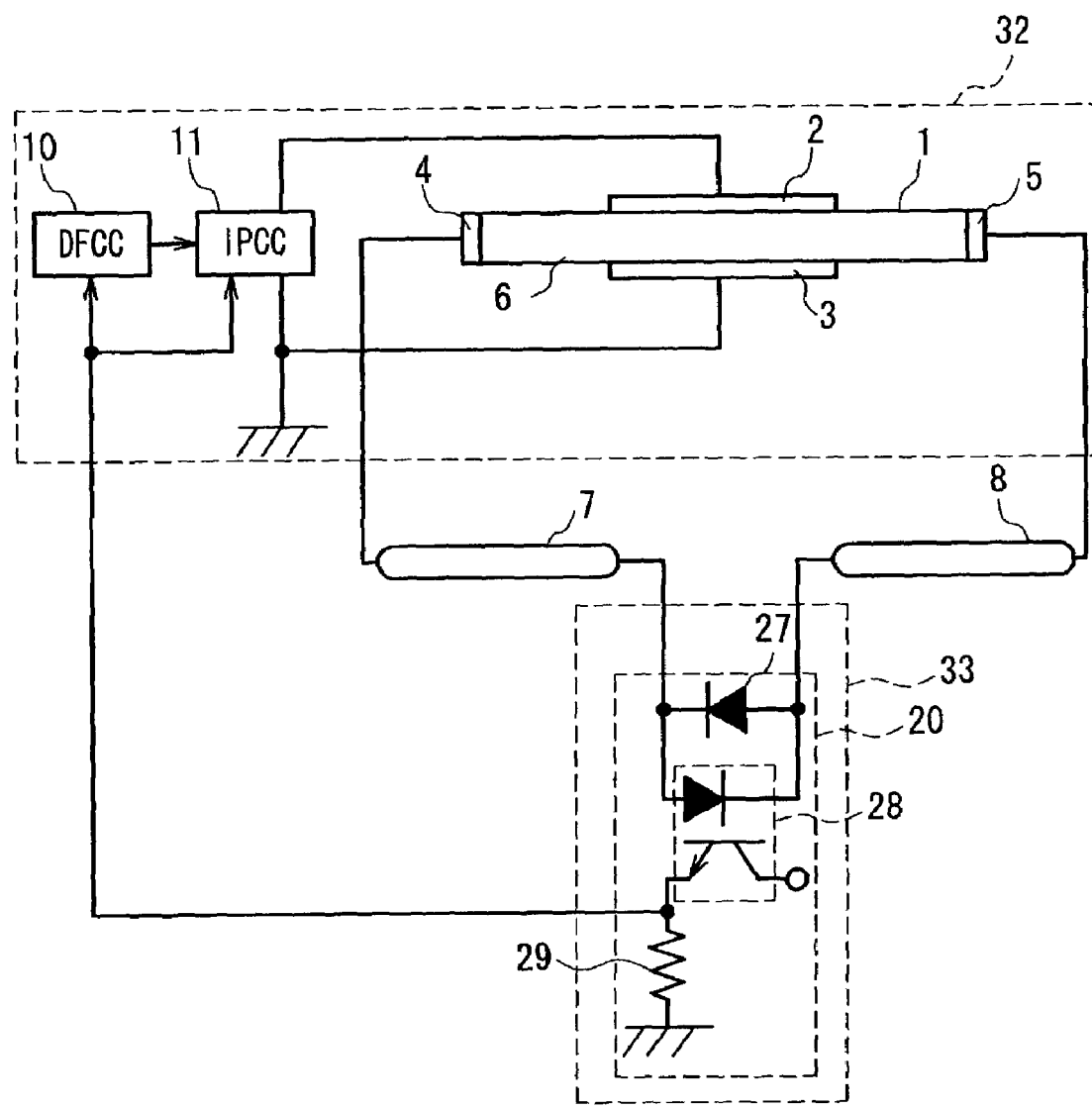
FIG. 10 is a block diagram showing the exemplary configuration of a driving circuit for a piezoelectric transformer shown in FIG. 9, and an exemplary internal configuration of the cold-cathode tube output detector circuit 20.

FIG. 9 is a block diagram showing an exemplary configuration of a driving circuit for a piezoelectric transformer of Embodiment 8 according to the present invention. FIG. 10 shows an example in which the cold-cathode tube output detector circuit shown in FIG. 9 is composed of a diode 27, an optical isolator (photocoupler) 28, and a resistor 29.

In FIGS. 9 and 10, the same components as those in FIGS. 1, 2, 3, 7, and 8 are denoted with the same reference numerals as those therein, and the description thereof will be omitted here.

In FIGS. 9 and 10, the piezoelectric transformer 1, the driving frequency control circuit 10, and the input power control circuit 11 are mounted on a first substrate 32. The cold-cathode tube output detector circuit 20 is mounted on a second substrate 33 that is different from the first substrate 32. By separating a portion including the piezoelectric transformer 1 that deals with a relatively large electric power from a portion including the cold-cathode tube output detector circuit 20 that deals with a small electric power by using separate substrates, the ability of the cold-cathode tube output detector circuit 20 to detect a current flowing through the cold-cathode tubes 7 and 8 is enhanced, and noise (in particular, noise due to the proximity to a ground line) can be suppressed from being mixed in a detection signal output from the cold-cathode tube output detector circuit 20.

The present embodiment is not limited to the driving circuit composed of the components shown in FIGS. 9 and 10, and other components may be used as long as they function in the same way as in FIGS. 9 and 10.

Furthermore, in the same way as in Embodiments 1, 2, 3, 6, and 7, it also is possible to set the driving frequency and the input voltage of the piezoelectric transformer through software by using a microcomputer, a peripheral apparatus such as a data storage device (e.g., memory) and the like, instead of setting them by the driving frequency control circuit 10 and the input power control circuit 11, based on the signal from the cold-cathode tube output detector circuit 20.

Embodiment 9

Figure 11:
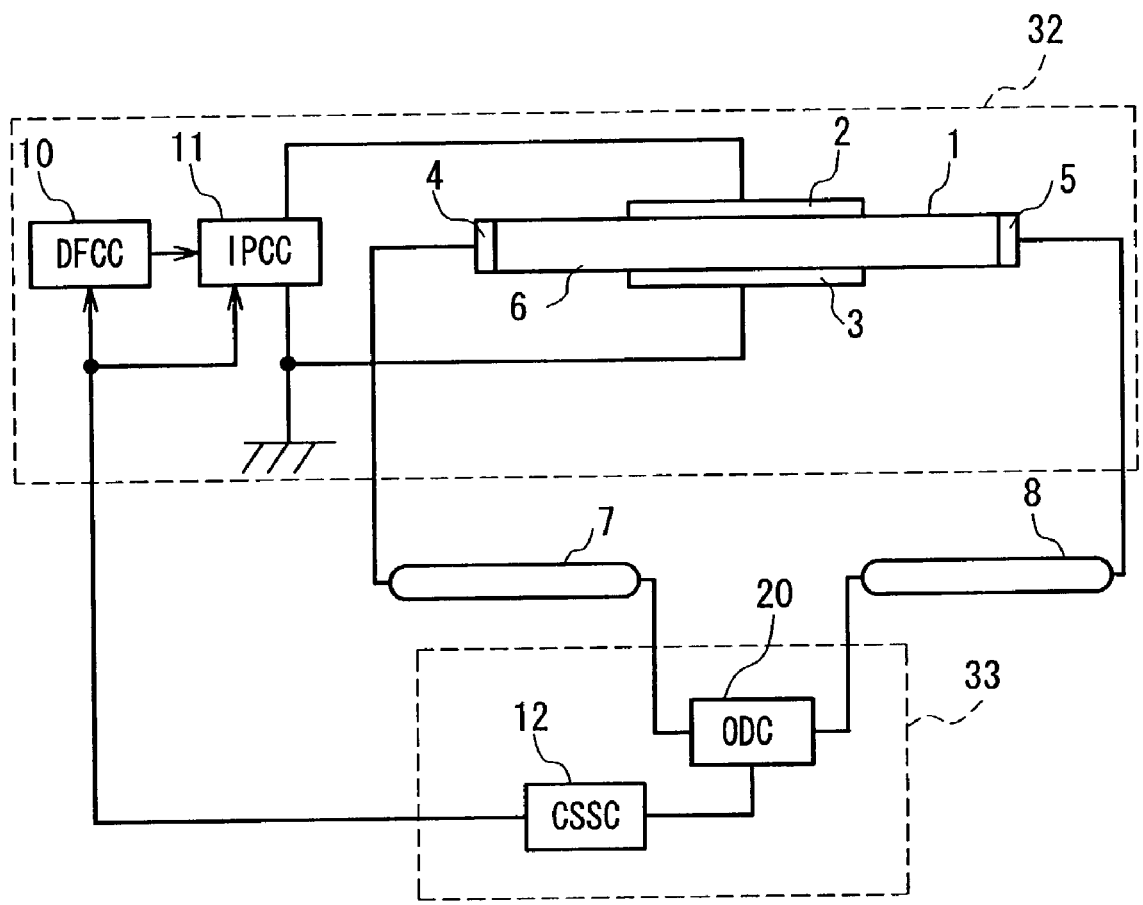
FIG. 11 is a block diagram showing an exemplary configuration of a driving circuit for a piezoelectric transformer of Embodiment 9 according to the present invention.
Figure 12:
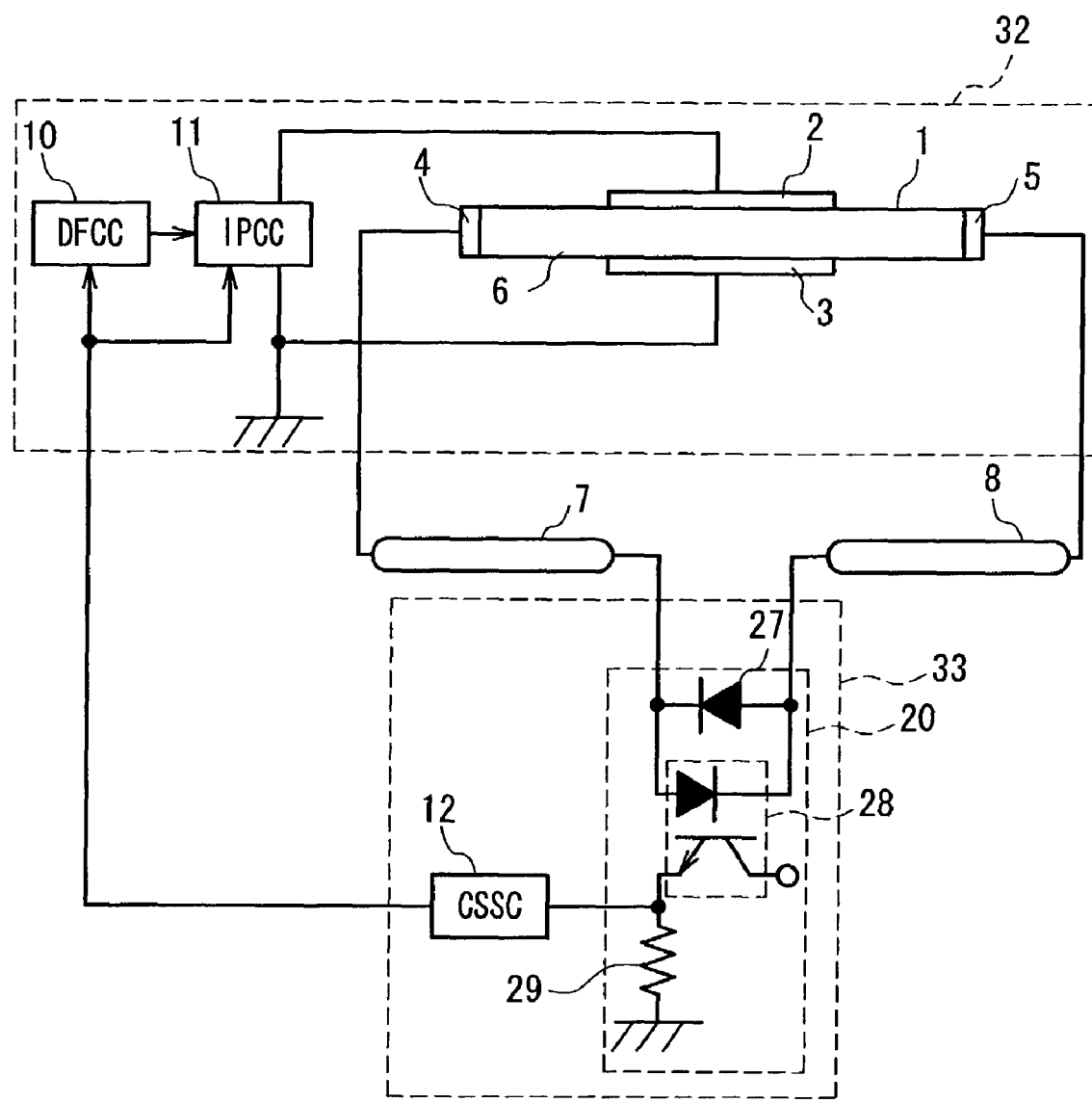
FIG. 12 is a block diagram showing the exemplary configuration of a driving circuit for a piezoelectric transformer shown in FIG. 11, and an exemplary internal configuration of the cold-cathode tube output detector circuit 20.

FIG. 11 is a block diagram showing an exemplary configuration of a driving circuit for a piezoelectric transformer of Embodiment 9 according to the present invention. FIG. 12 is a view showing an example in which the cold-cathode tube output detector circuit 20 shown in FIG. 11 is composed of a diode 27, an optical isolator (photocoupler) 28, and a resistor 29.

In FIGS. 11 and 12, the same components as those in FIGS. 1, 2, 3, 7, 8, 9, and 10 are denoted with the same reference numerals as those therein, and the description thereof will be omitted here.

In FIGS. 11 and 12, the piezoelectric transformer 1, the driving frequency control circuit 10, and the input power control circuit 11 are mounted on the first substrate 32. The cold-cathode tube output detector circuit 20 and the control signal selection circuit 12 are mounted on the second substrate 33 that is different from the first substrate 32. By separating a portion including the piezoelectric transformer 1 that deals with a relatively large electric power from a portion including the cold-cathode tube output detector circuit 20 that deals with a small electric power by using separate substrates, the ability of the cold-cathode tube output detector circuit 20 to detect a current flowing through the cold-cathode tubes 7 and 8 is enhanced, and noise (in particular, noise due to the proximity to a ground line) can be suppressed from being mixed in a detection signal output from the cold-cathode tube output detector circuit 20.

In addition, in the same way as in Embodiments 3 and 7, by allowing the control signal selection circuit 12 to select or extract only a frequency (driving frequency of the piezoelectric transformer 1) component of an output signal of the piezoelectric transformer 1 among signals of the cold-cathode tube output detector circuit 20, only a frequency component of an output signal of the piezoelectric transformer 1 can be used as a control signal. Therefore, in addition to the effects of Embodiments 1, 2, 6, 7, and 8, the driving control of the piezoelectric transformer and the brightness control of the cold-cathode tubes can be performed with a higher precision.

The present embodiment is not limited to the driving circuit composed of the components shown in FIGS. 11 and 12, and other components may be used as long as they function in the same way as in FIGS. 11 and 12.

Furthermore, in the same way as in Embodiments 1, 2, 3, 6, 7, and 8, it also is possible to set the driving frequency and the input voltage of the piezoelectric transformer through software by using a microcomputer, a peripheral apparatus such as a data storage device (e.g., memory) and the like, instead of setting them by the driving frequency control circuit 10 and the input power control circuit 11, based on the signal from the cold-cathode tube output detector circuit 20.

Embodiment 10

Figure 13:
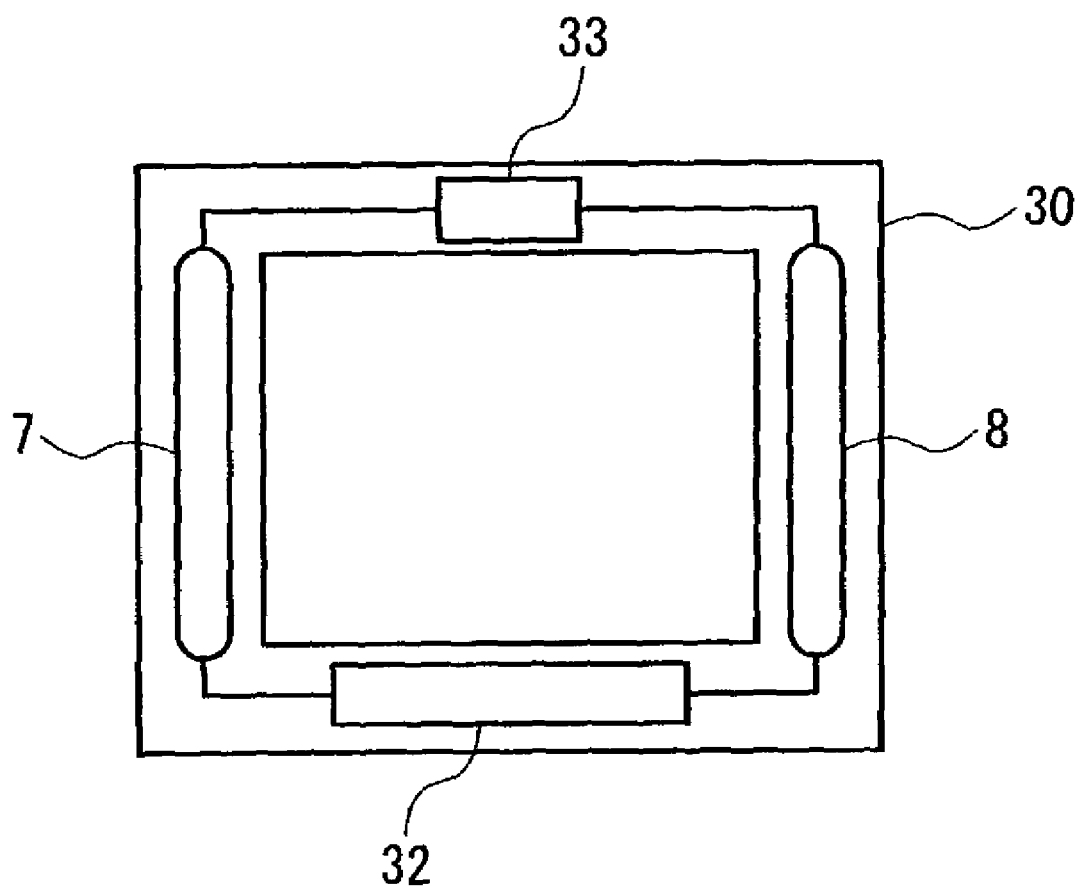
FIG. 13 is a schematic view showing an internal configuration of a liquid crystal panel of Embodiment 10 according to the present invention.
Figure 14:
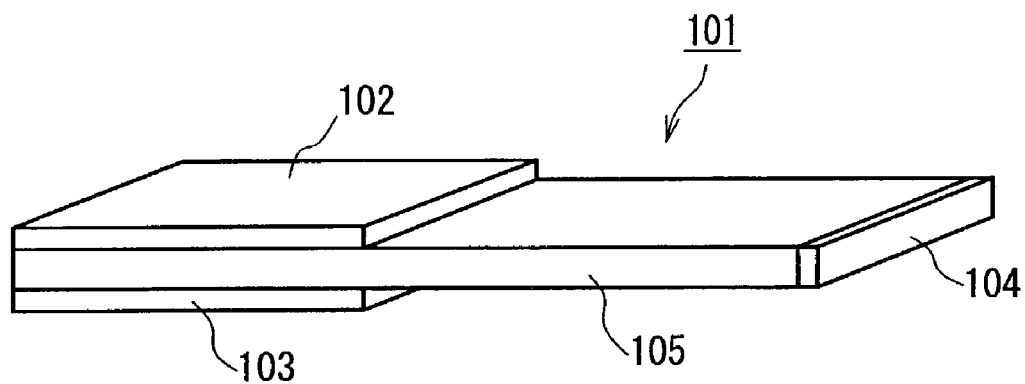
FIG. 14 is a perspective view showing a schematic configuration of a conventional piezoelectric transformer with one output on a secondary side.
Figure 15:
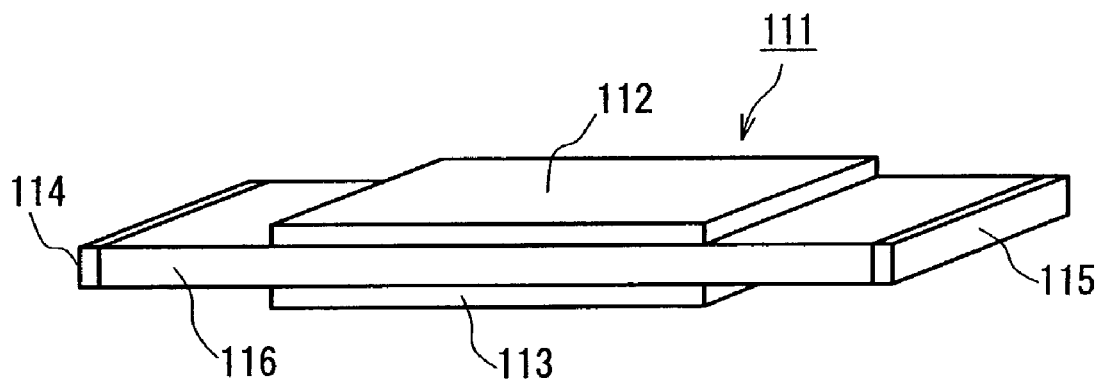
FIG. 15 is a perspective view showing a schematic configuration of a conventional piezoelectric transformer with two outputs on a secondary side.
Figure 16:
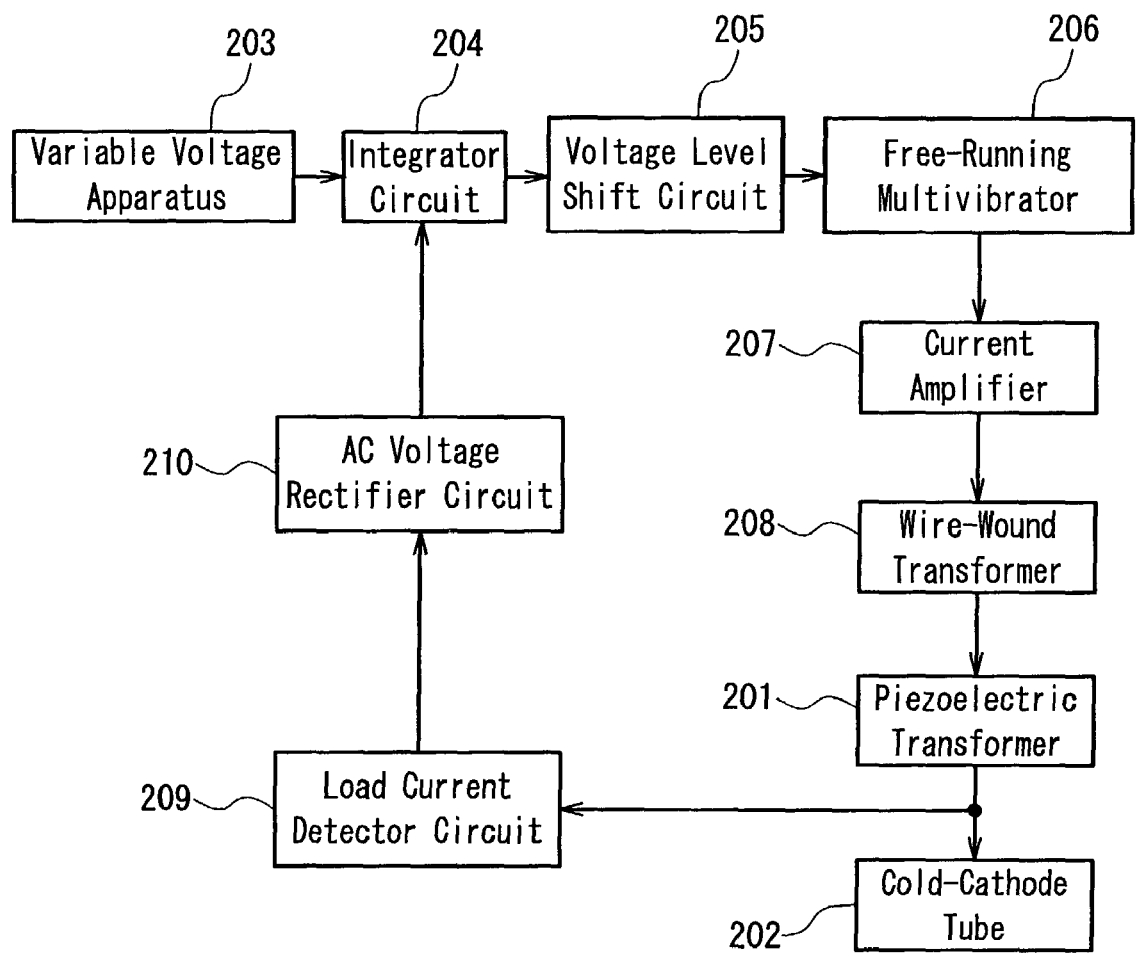
FIG. 16 is a block diagram showing an exemplary configuration of a conventional driving circuit for a piezoelectric transformer.
Figure 17:
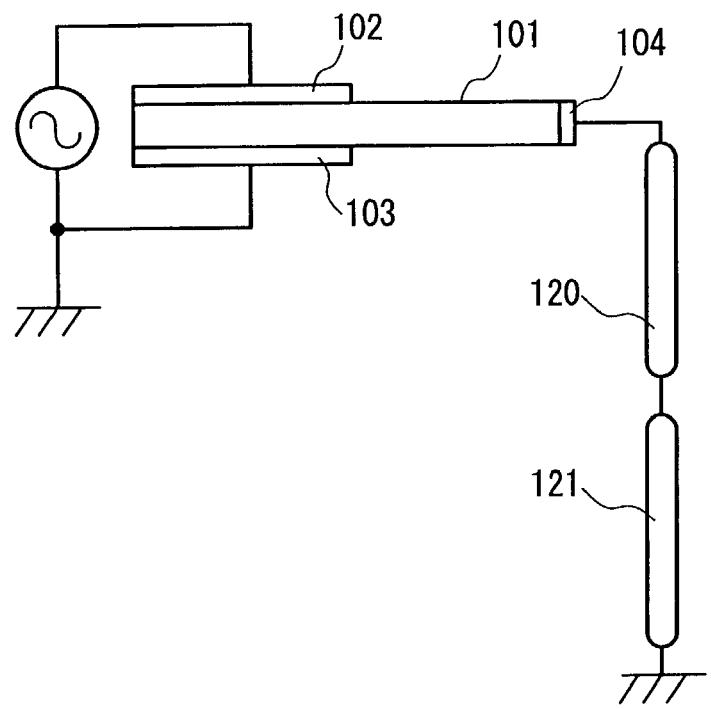
FIG. 17 is a schematic diagram showing a configuration of a cold-cathode tube lighting apparatus in which the piezoelectric transformer shown in FIG. 14 is connected in series to cold-cathode tubes.
Figure 18:
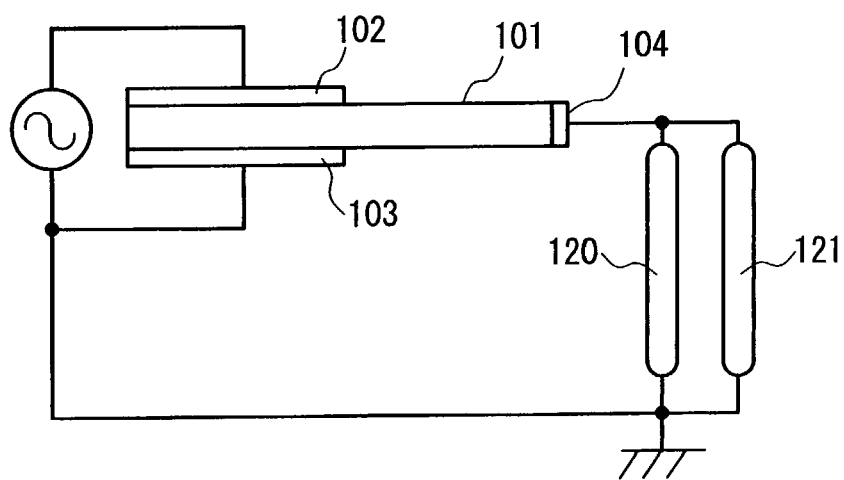
FIG. 18 is a schematic diagram showing a configuration of a cold-cathode tube lighting apparatus in which the piezoelectric transformer shown in FIG. 14 is connected in parallel to the cold-cathode tubes.

FIG. 13 shows, as Embodiment 10 of the present invention, an internal configuration in the case where the driving circuit for a piezoelectric transformer of Embodiment 8 or 9 is used as an inverter circuit driving cold-cathode tubes that function as a backlight of a liquid crystal panel of a liquid crystal display, a liquid crystal monitor, or the like.

In FIG. 13, reference numerals 7, 8 denote cold-cathode tubes, 30 denotes a liquid crystal panel, 32 denotes a first substrate on which circuit elements including a piezoelectric transformer, a driving frequency control circuit, and an input power control circuit in an inverter circuit are mounted, and 33 denotes a second substrate on which circuit elements including only a cold-cathode tube output detector circuit or a cold-cathode tube output detector circuit and a control signal selection circuit in an inverter circuit are mounted. The first substrate 32 is placed in proximity to one electrode of each of the cold-cathode tubes 7 and 8, and the second substrate 33 is placed in proximity to the other electrode of each of the respective cold-cathode tubes 7 and 8. The liquid crystal panel of the present embodiment may be mounted on the mobile phone of Embodiment 5 shown in FIG. 6.

In FIG. 13, the same components as those in FIGS. 5, 9, 10, 11, and 12 are denoted with the same reference numerals as those therein, and the description thereof will be omitted here.

According to the present embodiment, in addition to the effect of Embodiment 4, by separating the first substrate 32 that deals with a relatively large electric power including the piezoelectric transformer, the driving frequency control circuit, and the input power control circuit from the second substrate 33 that deals with a small electric power including only the cold-cathode tube output detector circuit or the cold-cathode tube output detector circuit and the control signal selection circuit, the ability to detect a current flowing through the cold-cathode tubes 7 and 8 is enhanced, and noise (in particular, noise due to the proximity to a ground line) can be suppressed from being mixed in a detection signal, in the same way as in Embodiments 8 and 9.

As described above, according to the present invention, even if a plurality of cold-cathode tubes have different impedances, the difference in brightness during steady lighting is small, and non-lighting of cold-cathode tubes at the commencement of lighting is unlikely to occur.

Furthermore, according to the present invention, a ratio at which a current flowing through the cold-cathode tubes and a detection signal influence each other can be suppressed. Therefore, the noise resistance of a current flowing through the cold-cathode tubes and a detection signal can be enhanced.

Furthermore, according to the present invention, only a frequency component of an output signal of the piezoelectric transformer can be used as a control signal. Therefore, the driving control of the piezoelectric transformer and the brightness control of the cold-cathode tubes can be performed with a higher precision.

Furthermore, a cold-cathode tube light-emitting apparatus, to which the driving circuit of the present invention is applied so as to control the light-emission of cold-cathode tubes, is built in a liquid crystal panel. Because of this, an output voltage of the piezoelectric transformer is varied in accordance with a load fluctuation at the commencement of lighting or during lighting of the cold-cathode tubes, so that an adverse effect on another circuit system mounted on a liquid crystal panel can be eliminated. Furthermore, an output voltage to the cold-cathode tubes has a substantially sine wave. Therefore, an unnecessary frequency component that does not contribute to lighting of the cold-cathode tubes can be reduced. Furthermore, the driving circuit of the present invention can be mounted even in a narrow space such as an edge of a liquid crystal panel, which leads to the miniaturization and reduced weight of the liquid crystal panel.

Furthermore, a cold-cathode tube light-emitting apparatus, to which the driving circuit of the present invention is applied so as to control the light-emission of cold-cathode tubes, is built in a liquid crystal panel. The liquid crystal panel is incorporated into a device such as a mobile phone, a personal digital assistant, a communication terminal, or the like. Because of this, even when the number of cold-cathode tubes is small, high brightness of a liquid crystal screen can be realized. In addition, by using a piezoelectric transformer instead of an electromagnetic transformer in order to allow the cold-cathode tubes to light up, electromagnetic noise can be suppressed from being generated, and noise to a device and an adverse effect due to cross modulation can be eliminated.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A driving circuit for a piezoelectric transformer including two primary side electrodes and two secondary side electrodes formed on a piezoelectric body and converting an AC voltage input from the primary side electrodes to output the convened AC voltages, with a phase difference of substantially 180°, from the secondary side electrodes, the driving circuit comprising:
- a plurality of loads, configured serially, connected to a secondary side of the piezoelectric transformer; and
- a load state detector portion connected in series to the plurality of loads, for detecting an output state of each load,
- wherein driving of the piezoelectric transformer is controlled based on a detection signal from the load state detector portion.

2. The driving circuit for a piezoelectric transformer according to claim 1, wherein the piezoelectric body has a rectangular shape and the secondary side electrode of the piezoelectric transformer is provided on each end face of the piezoelectric body in a longitudinal direction, and polarization directions of the piezoelectric body in a vicinity of the secondary side electrodes are the same in the longitudinal direction.

3. The driving circuit for a piezoelectric transformer according to claim 1, wherein the load is a cold-cathode tube.

4. The driving circuit for a piezoelectric transformer according to claim 3, wherein the number of the cold-cathode tubes is 2n (n is an integer of 1 or more).

5. A driving circuit for a piezoelectric transformer including a primary side electrode and a secondary side electrode formed on a piezoelectric body and converting an AC voltage input from the primary side electrode to output the convened AC voltage from the secondary side electrode, the driving circuit comprising:
- a plurality of loads connected to a secondary side of the piezoelectric transformer; and
- a load state detector portion connected in series to the plurality of loads, for electrically separating and detecting an output state of each load,
- wherein driving of the piezoelectric transformer is controlled based on a detection signal from the load state detector portion.

6. The driving circuit for a piezoelectric transformer according to claim 5, wherein the piezoelectric body has a rectangular shape and the secondary side electrode of the piezoelectric transformer is provided on each end face of the piezoelectric body in a longitudinal direction, and polarization directions of the piezoelectric body in a vicinity of the secondary side electrodes are the same in the longitudinal direction.

7. The driving circuit for a piezoelectric transformer according to claim 5, wherein the load is a cold-cathode tube.

8. The driving circuit for a piezoelectric transformer according to claim 7, wherein the number of the cold-cathode tubes is 2n (n is an integer of 1 or more).

9. The driving circuit for a piezoelectric transformer according to claim 5, wherein the load state detector portion includes an optical isolator composed of a light-emitting diode and a phototransistor.

10. A driving circuit for a piezoelectric transformer including two primary side electrodes and two secondary side electrodes formed on a piezoelectric body and converting an AC voltages, with a phase difference of substantially 180°, input from the primary side electrodes to output the convened AC voltage from the secondary side electrode, the driving circuit comprising:
- a plurality of loads, configured serially, connected to a secondary side of the piezoelectric transformer;
- a load state detector portion connected in series to the plurality of loads, for detecting an output state of each load; and
- a frequency selection portion for selectively outputting only a frequency component in a vicinity of a driving frequency of the piezoelectric transformer in a detection signal from the load state detector portion,
- wherein driving of the piezoelectric transformer is controlled based on a signal from the frequency selection portion.

11. The driving circuit for a piezoelectric transformer according to claim 10, wherein the piezoelectric body has a rectangular shape and the secondary side electrode of the piezoelectric transformer is provided on each end face of the piezoelectric body in a longitudinal direction, and polarization directions of the piezoelectric body in a vicinity of the secondary side electrodes are the same in the longitudinal direction.

12. The driving circuit for a piezoelectric transformer according to claim 10, wherein the number of the cold-cathode tubes is 2n (n is an integer of 1 or more).

* * * * *

UNITED STATES PATENT AND TRADEMARK OFFICE
CERTIFICATE OF CORRECTION

PATENT NO. : 7,038,354 B2  Page 1 of 1
APPLICATION NO. : 10/306516
DATED : May 2, 2006
INVENTOR(S) : Takeda et al.

It is certified that error appears in the above-identified patent and that said Letters Patent is hereby corrected as shown below:

Column 17, line 2(claim 1): "convened" should read --converted--
Column 17, line 31(claim 5): "convened" should read --converted--
Column 18, line 17(claim 10): "voltages" should read --voltage--
Column 18, line 19(claim 19): "convened" should read --converted--

Signed and Sealed this

Twenty-seventh Day of February, 2007

JON W. DUDAS
*Director of the United States Patent and Trademark Office*